(12) United States Patent
Rathmell et al.

(10) Patent No.: US 7,329,882 B2
(45) Date of Patent: Feb. 12, 2008

(54) ION IMPLANTATION BEAM ANGLE CALIBRATION

(75) Inventors: Robert D. Rathmell, Murphy, TX (US); Dennis E. Kamenitsa, Austin, TX (US)

(73) Assignee: Axcelis Technologies, Inc., Beverly, MA (US)

( * ) Notice: Subject to any disclaimer, the term of this patent is extended or adjusted under 35 U.S.C. 154(b) by 255 days.

(21) Appl. No.: 11/288,908

(22) Filed: Nov. 29, 2005

(65) Prior Publication Data
US 2007/0120074 A1    May 31, 2007

(51) Int. Cl.
*H01J 37/304*    (2006.01)
*H01J 37/317*    (2006.01)

(52) U.S. Cl. .............................. 250/492.21
(58) Field of Classification Search .............. None
See application file for complete search history.

(56) References Cited

U.S. PATENT DOCUMENTS

| | | | | |
|---|---|---|---|---|
| 6,255,662 B1 * | 7/2001 | Rubin et al. | | 250/492.21 |
| 6,437,350 B1 * | 8/2002 | Olson et al. | | 250/492.21 |
| 6,573,518 B1 * | 6/2003 | Renau et al. | | 250/492.21 |
| 6,791,094 B1 * | 9/2004 | Olson et al. | | 250/397 |

OTHER PUBLICATIONS

"Beam Parallelism in the 8250 Medium Current Implanter", Robert D. Rathmell, Dennis E. Kamenitsa, Monty L. King and Andrew M. Ray, IEEE, Conference Proceedings for the Ion Implantation Technology, 1998, 4 pgs.
"Beam Angle Control on the VIISta 80 Ion Implanter", Christopher Campbell, James Cummings, Robert Lindberg, Joseph C. Olson, Svetlana B. Radovanov and Donna L. Smatlak, IEEE, 2002, 4 pgs.
"Precise Beam Incidence Angle Control on the VIISta 810HP", J. Weeman, J. Olson, B.N. Guo, U. Jeong, G.C. Li and S. Mehta, IEEE, 2002, 3 pgs.

* cited by examiner

*Primary Examiner*—Jack I. Berman
(74) *Attorney, Agent, or Firm*—Eschweiler & Associates, LLC

(57) ABSTRACT

One or more aspects of the present invention pertain to determining a relative orientation between an ion beam and lattice structure of a workpiece into which ions are to be selectively implanted by the ion beam, and calibrating an ion implantation system in view of the relative orientation. The beam to lattice structure orientation is determined, at least in part, by directing a divergent ion beam at the workpiece and finding the angle of the aspect of the divergent beam that implants ions substantially parallel to crystal planes of the workpiece, and thus causes a small amount of damage to the lattice structure.

21 Claims, 10 Drawing Sheets

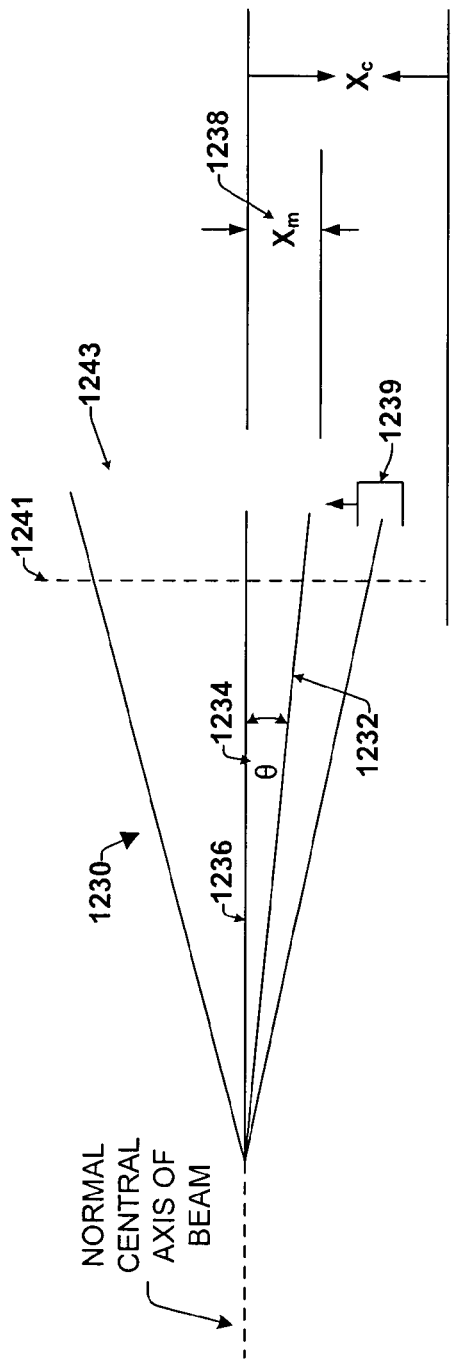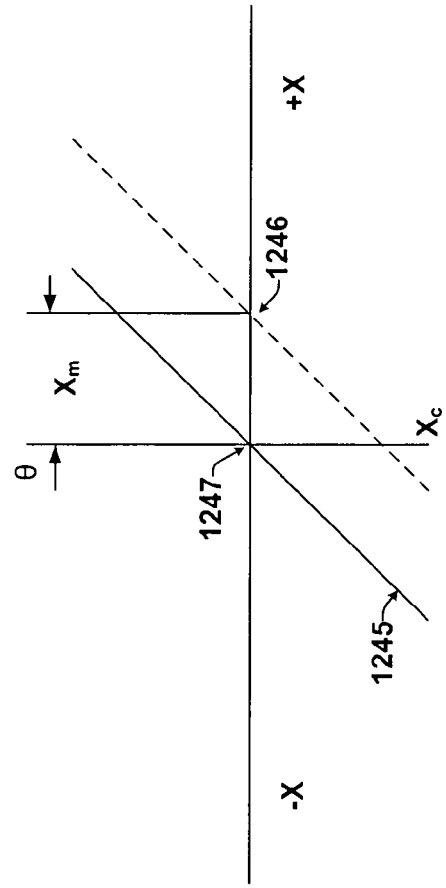
Fig. 11
Fig. 12

ION IMPLANTATION BEAM ANGLE CALIBRATION

FIELD OF THE INVENTION

The present invention relates generally to ion implantation systems, and more particularly to calibrating a beam angle relative to a workpiece and more particularly to crystal planes of the target workpiece.

BACKGROUND OF THE INVENTION

Ion implantation systems are the mechanisms utilized to dope semiconductor substrates with dopants or impurities in integrated circuit manufacturing. In such systems, a dopant material is ionized and an ion beam is generated there-from. The beam is directed at the surface of a semiconductor wafer or workpiece in order to implant the wafer with one or more dopant elements. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for directing and/or filtering (e.g., mass resolving) the ions within the beam using magnetic fields, and a target chamber containing one or more semiconductor wafers or workpieces to be implanted by the ion beam.

Ion implanters are advantageous because they allow for precision with regard to both quantity and placement of dopants within the silicon. In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. Ion energy, on the other hand, is used to control the degree or depth to which ions are implanted into the workpiece, which can be useful in establishing different junction depths in semiconductor devices, for example.

One commercially available ion implantation system uses an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions that strike the wafers to penetrate those wafers in the implantation chamber. Such selective implantation thus allows an integrated circuit to be fabricated.

However, while much thought and consideration is usually given to the orientation (e.g., tilt and/or twist, etc.) of the ion beam relative to the wafer, ion implantation systems generally orient the ion beam relative to the mechanical surface of a wafer, with little to no consideration given to variations between the wafer's internal lattice structure and its mechanical surface. Additionally, wafers are purchased with a nominal lattice structure relative to their mechanical surfaces. In particular, the wafers are designated with Miller Index data, such as (100) which is indicative of the relative orientation of the lattice structure to the cut surface of the wafer. However, imprecisions associated with the wafer manufacturing process can cause the actual orientation of the lattice structure to differ from this nominal value by up to a degree.

The actual orientation of the ion beam to the lattice structure of a wafer is important because it can affect channeling, and more particularly the repeatability of channeling, among other things. For example, in some situations it may be desirable to "align" the ion beam with the lattice structure so that few ions encounter the structure and the ions are thereby easily implanted relatively deeply into the substrate. Alternatively, it may be desirable to somewhat "mis-align" the ion beam with the lattice structure so that some of the ions encounter some of the lattice structure and are blocked, slowed down or reflected thereby. In either instance, improper alignment can lead to undesired degrees of channeling (e.g., too little or too much). Additionally, the deviations from the nominal lattice orientation and the dimensions of features formed upon the wafer can affect shadowing, and adversely impact the implantation process and resulting devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention pertain to determining a relative orientation between an ion beam and lattice structure of a workpiece into which ions are to be selectively implanted by the ion beam, and calibrating an ion implantation system in light of the determined relative orientation. The beam to lattice structure orientation is determined, at least in part, by directing a divergent ion beam at the workpiece and finding a location on the workpiece where little damage is done to the lattice structure of the workpiece. This corresponds to a location where ions are implanted substantially parallel to crystal planes of the workpiece. The angle of the aspect of the divergent beam that accounts for this implantation is determined and the ion implantation system is calibrated in light thereof.

According to one or more aspects of the present invention, a method of establishing a relative orientation between an ion beam and lattice structure of a workpiece into which ions are to be selectively implanted by the ion beam is disclosed. The method includes directing a divergent ion beam toward a workpiece into which ions are to be selectively implanted, and then determining an angle of a ray of the ion beam that provides a stream of ions substantially parallel to crystal planes of the workpiece. The ion implantation system can then be calibrated in light of the determined angle of the ray.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 3 is a perspective view of an example of a portion of a lattice structure, such as that depicted in FIG. 1, wherein a mechanical surface of the structure is not substantially co-planar there-with.

FIG. 11 is a diagram illustrating an example of a divergent ion beam being measured by a moving profiler.

FIG. 12 is a diagram illustrating beam angle relative to profiler position and crystal planes.

DETAILED DESCRIPTION OF THE INVENTION

Figure 1:
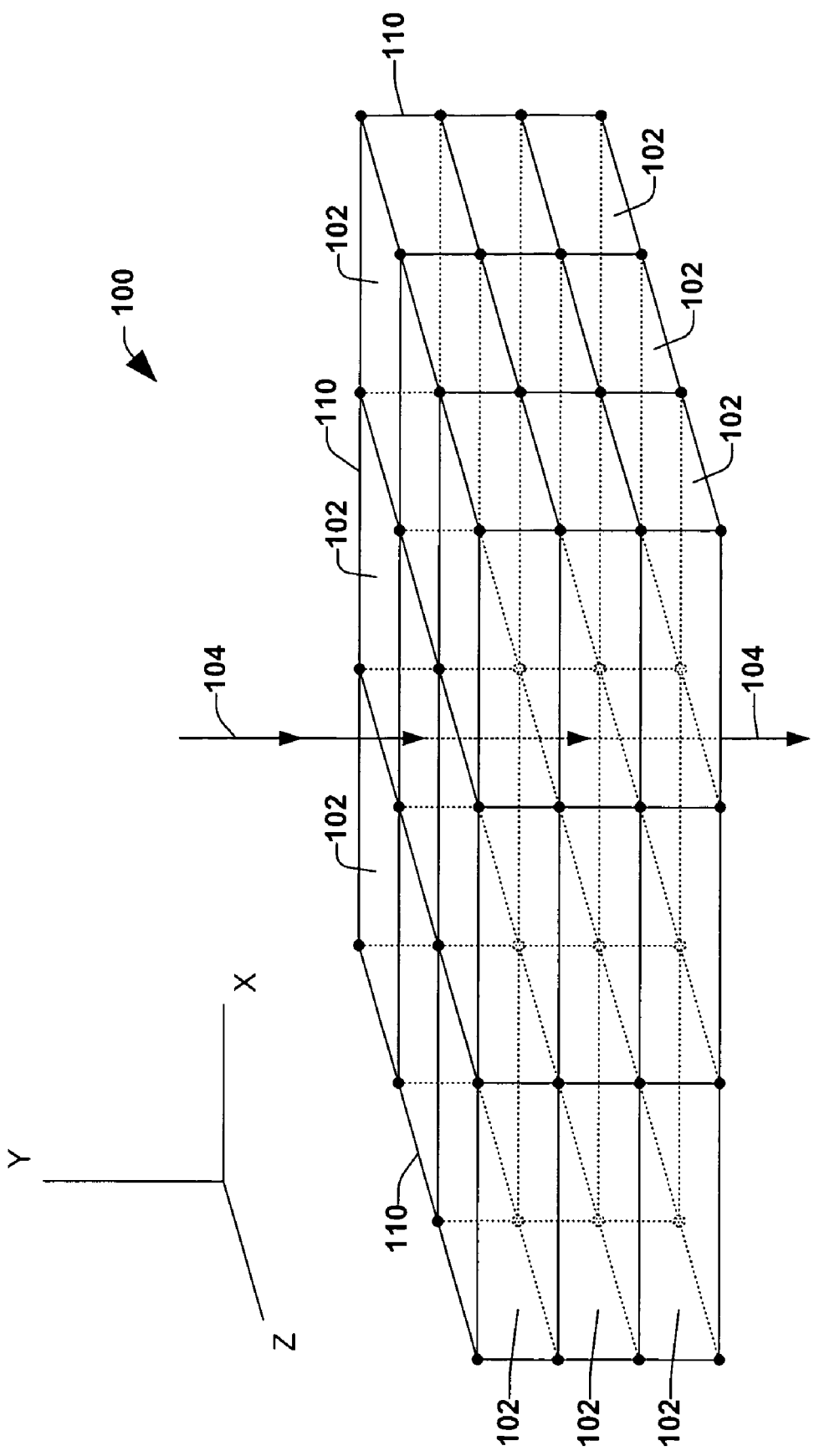
FIG. 1 is a perspective view of an example of a portion of a lattice structure wherein an ion beam is directed at the lattice structure substantially parallel to planes of the lattice structure.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

As alluded to above, in semiconductor fabrication processing, semiconductor wafers or workpieces are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

The base layers or substrate are generally composed of silicon in a crystalline form. Materials are said to have a crystalline structure when their atoms are arranged in three dimensions in a regular manner, known as a crystalline lattice. By way of example, FIG. 1 illustrates a portion of a generic lattice structure 100 having a generally cubic configuration. In particular, in the example illustrated, the lattice structure 100 has twenty-seven (e.g., three by three by three) cells 102 that are generally cubical in shape. The lattice structure of the crystal exists within planes 110, and these planes 110 are substantially perpendicular to one another in the illustrated example (e.g., in the x, y, and z directions). It is to be appreciated, however, that lattice structures can come in any of a variety of different configurations and have any number of cells having any number of a variety of different shapes, such as diamond, pyramidal, hexagonal, etc.

The silicon base layers utilized in semiconductor fabrication are also referred to as wafers or substrates, at least in part, because they are cut from bulk silicon. In particular, very specific types of single crystals of silicon, known as boules, are grown into long lengths and thin slices (e.g., wafers) are cut there-from.

An important parameter of a semiconductor doping process is the angle of incidence between a beam of ions utilized to implant the dopant ions within the substrate and the internal lattice structure of the semiconductor material. The angle of incidence is important because it plays a role in a phenomenon known as channeling, among other things. In particular, as illustrated in FIG. 1, if the direction of the beam of dopant ions 104 is substantially parallel to (vertical) planes 110 of the lattice structure, the beam may pass there-through with less energy loss per unit length, because ions moving in the space between the planes have fewer collisions with crystal atoms.

As such, the ions may, among other things, be implanted deeply within the substrate (e.g., within a central channel within FIG. 1). It can be appreciated that other aspects can also affect channeling, such as the degree of amorphization of the substrate, the atomic mass of the substrate and the mass and/or energy of ions within the beam, for example. For instance, the greater the energy of the ions within the beam 104, the more likely the ions may be implanted deeply into the substrate.

Figure 2:
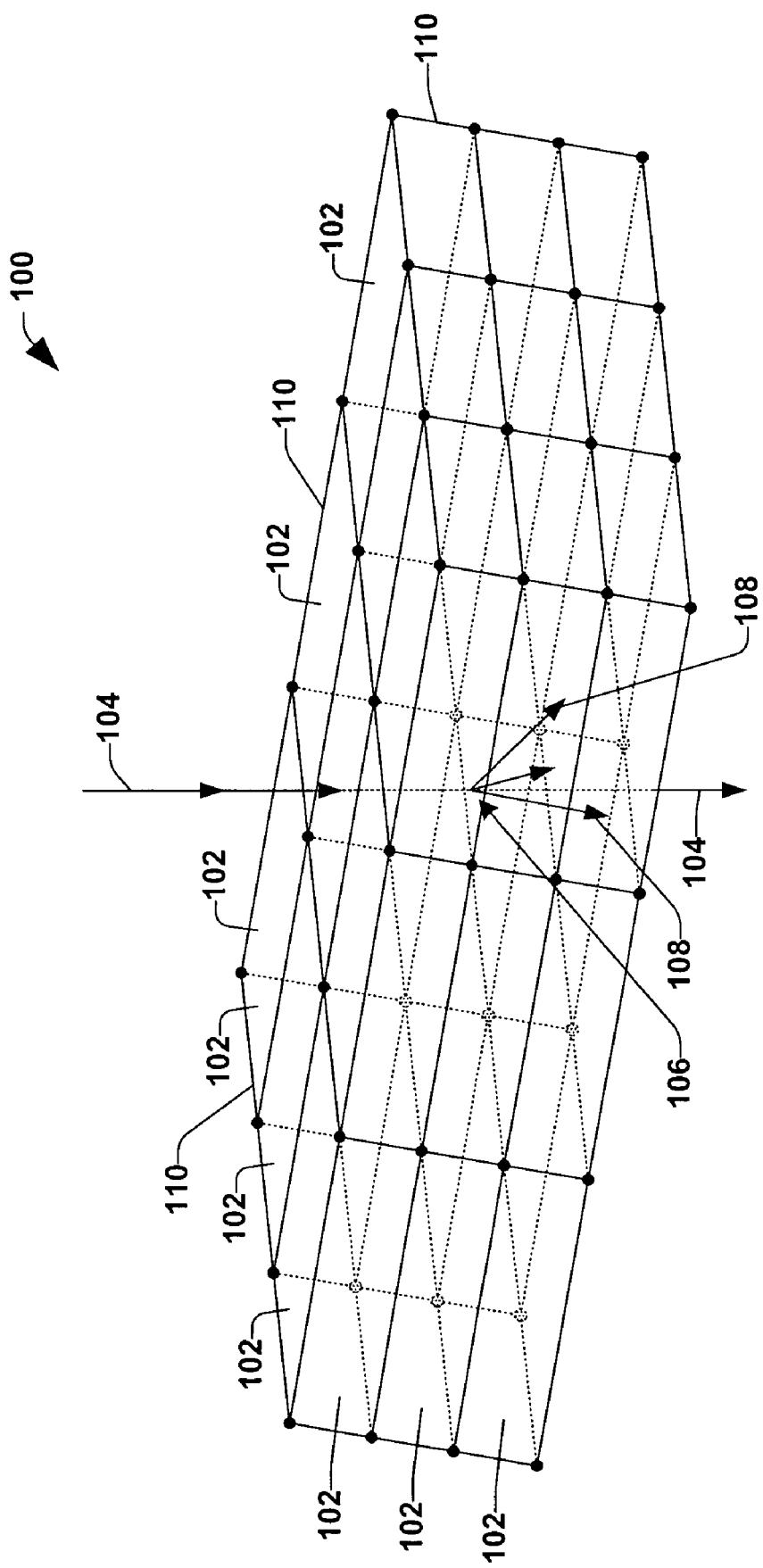
FIG. 2 is a perspective view of an example of a portion of a lattice structure, such as that depicted in FIG. 1, wherein an ion beam is directed at the lattice structure not substantially parallel to planes of the lattice structure.

In FIG. 2, for example, the direction of the beam 104 is not substantially parallel to (vertical) planes 110 of the lattice structure 100. As such, some of the ions within the ion beam 104 will likely impact portions 106 of the lattice structure and alter (e.g., damage) the lattice structure. In so doing, the ions will likely lose energy and slow down and/or be scattered from the original direction as indicated by arrows 108, thereby coming to rest in shallower portions of the workpiece. Accordingly, it may be desirable to orient the ion beam at a particular orientation relative to the lattice structure to mitigate channeling and/or localize doping.

Figure 3:
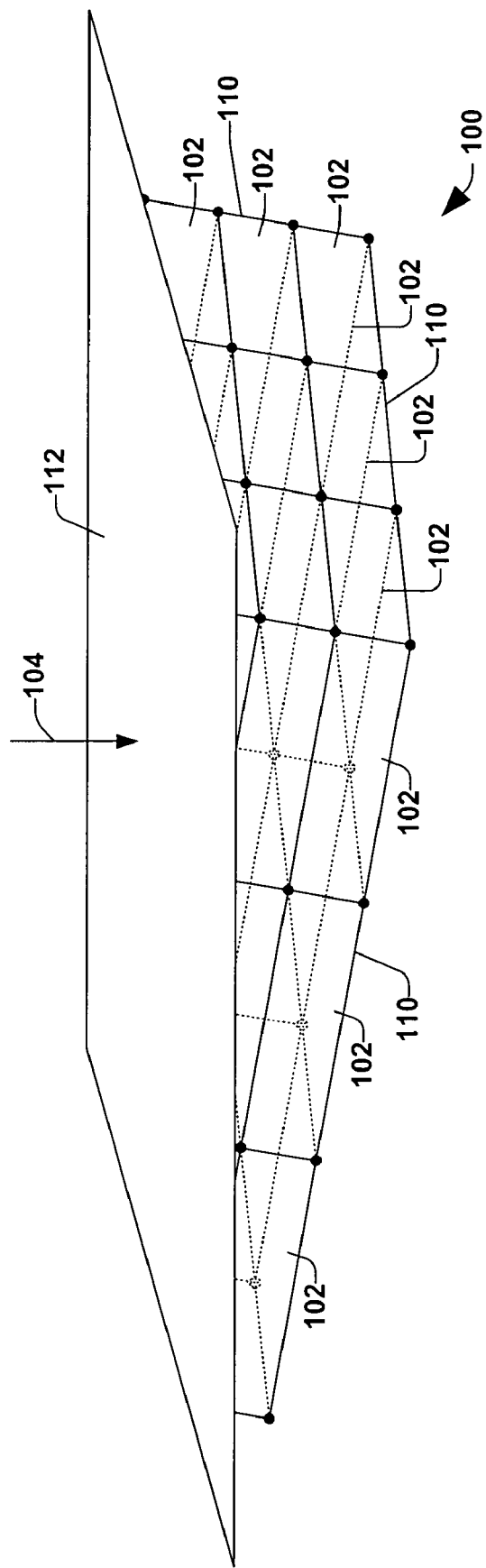

Nevertheless, the ion beam is generally calibrated or oriented relative to a mechanical surface of the wafer, where the surface may not be aligned with the lattice structure due to imprecisions associated with slicing the wafer from the boule, for example. By way of example, FIG. 3 illustrates a situation wherein the wafer has been sliced such that the mechanical surface 112 thereof is does not lie within a (horizontal) plane 110 of the lattice structure 100. In this manner, there can be said to be some "crystal cut error"

where crystal cut error is generally defined as the variation between the crystalline lattice structure 100 and the mechanical surface 112 of the wafer. Such deviations can vary by about ±1° or more, for example. Thus, it can be appreciated that the greater the crystal cut error, the more difficult it becomes to establish a predictable and desired orientation between the ion beam 104 and the lattice structure 100. As such, it becomes more and more difficult to attain reliable, predictable and desirable electrical performance.

Accordingly, it can be appreciated that it would be desirable to be able to know the relative orientation of the ion beam to the lattice structure of the workpiece so that a desired implantation orientation can be reliably established. Additionally, shadowing effects also weigh in favor of developing a known implantation orientation. Shadowing generally results from the continuing trend in the electronics industry to scale down features to produce smaller, more powerful devices (e.g., cell phones, digital cameras, etc.) that can perform a greater number of increasingly complex functions with less power. To achieve this, semiconductors and integrated circuits (e.g., transistors, etc.) utilized in these devices are continually reduced in size. The ability to "pack" more of these devices onto a single semiconductor substrate, or portion thereof (known as a die) also improves fabrication efficiency and yield.

To increase the packing density, features formed in and on a wafer as part of the semiconductor fabrication process are formed closer together, and the spacings established between such features are correspondingly made narrower. The respective heights of some of the features, however, may not be reduced. The generally fixed feature height coupled with the shrinking spacings between features results in increased shadowing, whereby portions of the wafer that are to be doped receive little to no dopant ions. Such shadowing can become more exaggerated where an ion implantation angle is increased, such as to diminish channeling, for example.

Figure 4:
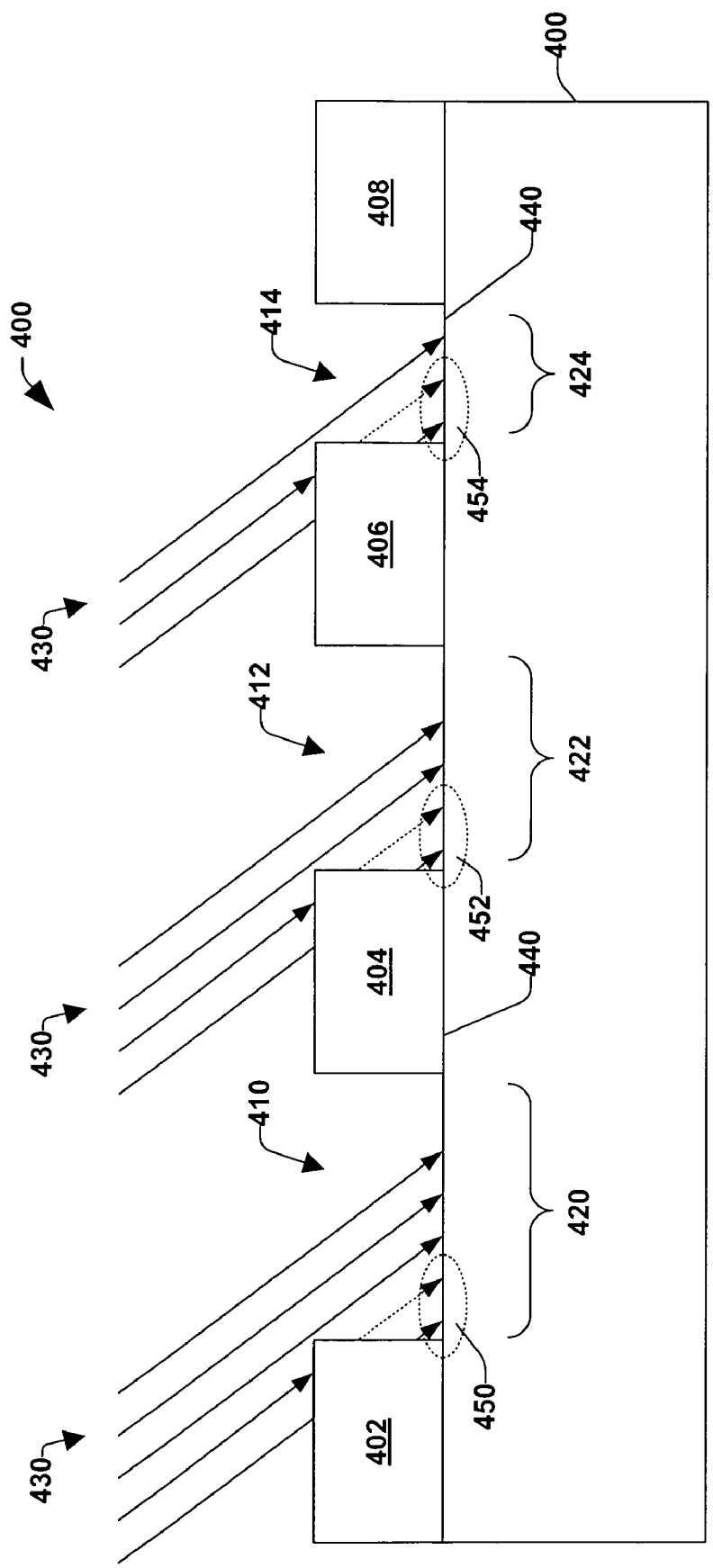
FIG. 4 is a cross-sectional view of a portion of a semiconductor substrate having features formed thereon that are separated by varying distances and that experiences shadowing effects to varying degrees during ion implantation.

Turning to FIG. 4, for example, a cross sectional view of a portion of a semiconductor substrate or wafer 400 has a plurality of features 402, 404, 406, 408 formed thereon, and respective spacings 410, 412, 414 are defined there-between. The features 402, 404, 406, 408 are formed out of a resist material and thus are all of substantially the same height.

Areas 420, 422, 424 of the substrate 400 exposed by the spacings 410, 412, 414 are to be doped via ion implantation. Accordingly, one or more ion beams 430 are directed at the substrate 400 to perform the doping. The beams 430 are, however, oriented at an angle with respect to a surface 440 of the substrate 400 to mitigate channeling effects, for example. Some of the beams 430 thus have some of their ions blocked by portions (e.g., corners) of the features 402, 404, 406, 408. Such shadowing may leave some regions of the device improperly dosed. Accordingly, adverse effects associated with shadowing can become exaggerated depending upon implantation angles. It can thus be appreciated that it would be desirable to know an implantation orientation to be able to predict shadowing effects and channeling, for example.

The above discussions of channeling and shadowing serve to make the point that angle control of the ion beam to the wafer surface and crystal planes is important to good process control. It is therefore important that there be a method to measure the angle of the incident ions and that measurement technique should be calibrated to the crystal planes of the wafer. It will be appreciated that the effect of an implant on the silicon wafer can be measured electrically using a probe that measures resistivity or sheet resistance at many points on the wafer, or through surface photovoltage techniques as provided by Q C Solutions, Inc., Billerica, Mass. Alternatively, it may be measured by an optical modulation technique such as with a Thermo-probe, built by Therma-Wave, Inc. Fremont, Calif. 94539. While each of these may show where the channeling is strongest, the latter measurement technique is particularly sensitive to crystalline damage and is useful to determining where on a wafer ions are moving more nearly parallel to the crystal planes. According to one or more aspects or embodiments of the present invention, an ion beam is made to span a range of implant angles and a tool (e.g., Thermo-probe) is used to detect where those angles matched the orientation of the crystal planes to calibrate the in-situ hardware that measures the incident angle of the ion beam.

Figure 5:
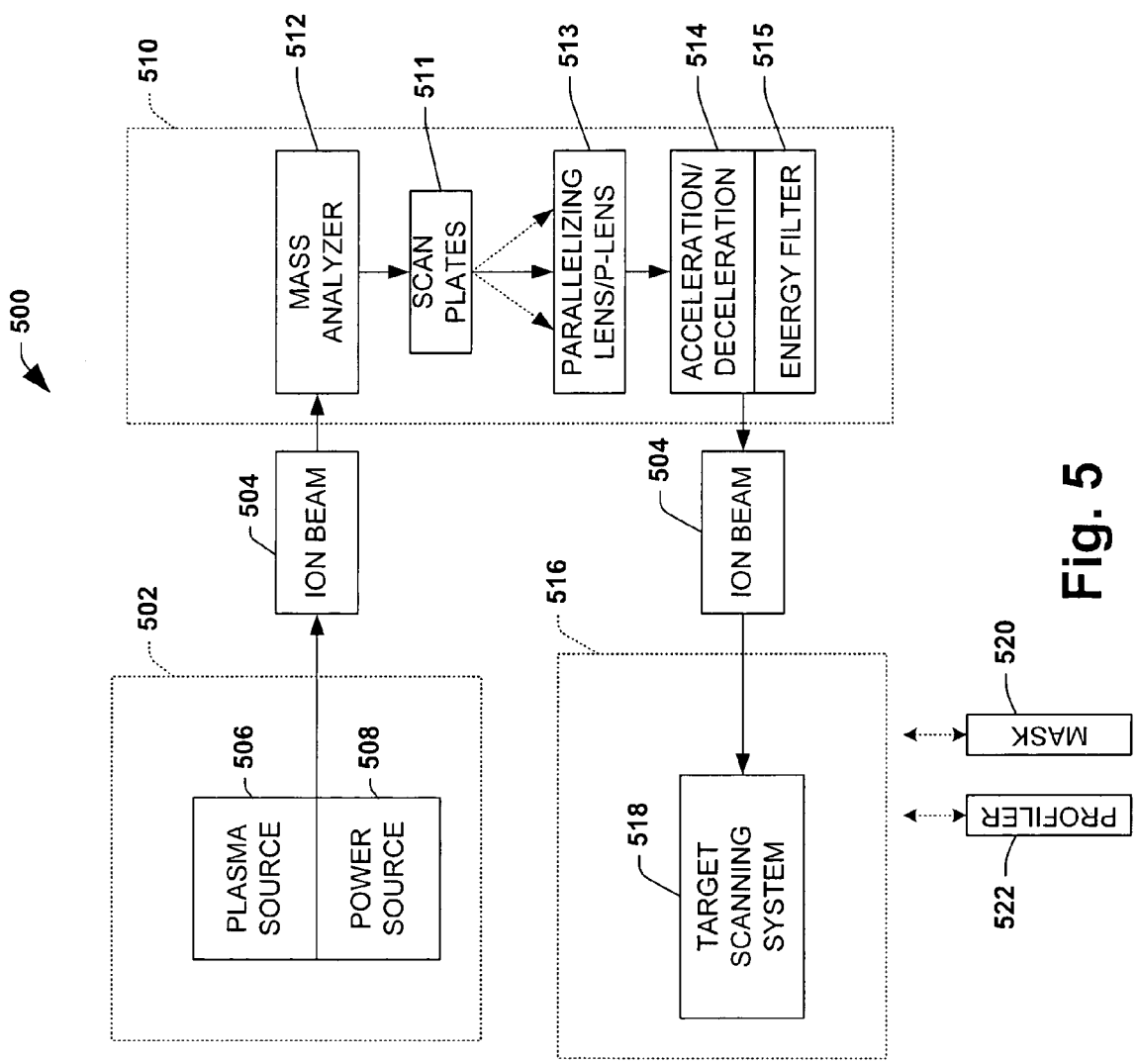
FIG. 5 is a block diagram illustrating an exemplary ion implantation system wherein one or more aspects of the present invention may be implemented.

Referring to FIG. 5, an exemplary ion implantation system 100 wherein one or more aspects or embodiments of the present invention may be implemented is depicted in block diagram form. The system 500 includes an ion source 502 for producing an ion beam 504 along a beam path. The ion beam source 502 includes, for example, a plasma source 506 with an associated power source 508. The plasma source 506 may, for example, comprise a relatively long plasma confinement chamber from which an ion beam is extracted.

A beamline assembly 510 is provided downstream of the ion source 502 to receive the beam 504 therefrom. The beamline assembly 510 includes a mass analyzer 512 as well as an acceleration/deceleration component 514. The beamline assembly 510 is situated along the path to receive the beam 504. The mass analyzer 512 includes a field generating component, such as a magnet and operates to provide a field across the beam path so as to deflect ions from the ion beam 504 at varying trajectories according to mass (e.g., charge to mass ratio). Ions traveling through the magnetic field experience a force which directs individual ions of a desired mass along the beam path and which deflects ions of undesired mass away from the beam path.

Electrostatic scan plates 511 located within the beamline assembly 510 sweep the beam 504 left and right (illustrated in phantom) at high frequency to make the ions fan out to span a large target, such as a 300 mm diameter wafer. After traveling a distance, the ions pass through a curved acceleration gap called a P-lens 513 which, when a bias voltage is applied to this gap, accelerates the scanned ions in a generally forward direction that cancels the divergent component of the rays at respective scan angles resulting in the ions moving generally parallel to the central axis after exiting 513.

The acceleration/deceleration component 514 may include one or more gaps that are operable to accelerate and/or decelerate ions within the beam. Electrostatic plates 515 serve as an energy filter to deflect the beam 504 vertically to decontaminate the beam by bending the beam and separating out contaminating neutral particles from the beam 504.

An end station 516 is also provided in the system 500 to receive the ion beam 504 from the beamline assembly 510. The end station 516 supports one or more workpieces such as semiconductor substrates (not shown) along the beam path for ion implantation. The end station 516 includes a target scanning system 518 for translating or scanning one or more target workpieces and the ion beam 504 relative to one another. The target scanning system 518 may provide for batch or serial implantation, for example, as may be desired.

A mask 520 and profiler 522 may be used in correlating the particular location on the wafer to a particular implantation angle. For example, the mask 520 and the profiler 522 can be selectively brought in front of the ion beam 504 so that the beam impinges thereon. The mask 520 comprises a plurality of tines separated by respective slots that allow beamlets of radiation to pass there-through onto the profiler 522, which is located behind (or downstream) of the mask 520. The profiler is radiation sensitive such that the profiler outputs a current indicative of the intensity of the impinging radiation. A peak intensity of radiation at a location other than immediately behind a slot means that the radiation is not coming straight through the slot, but is instead coming in at some angle.

Figure 6:
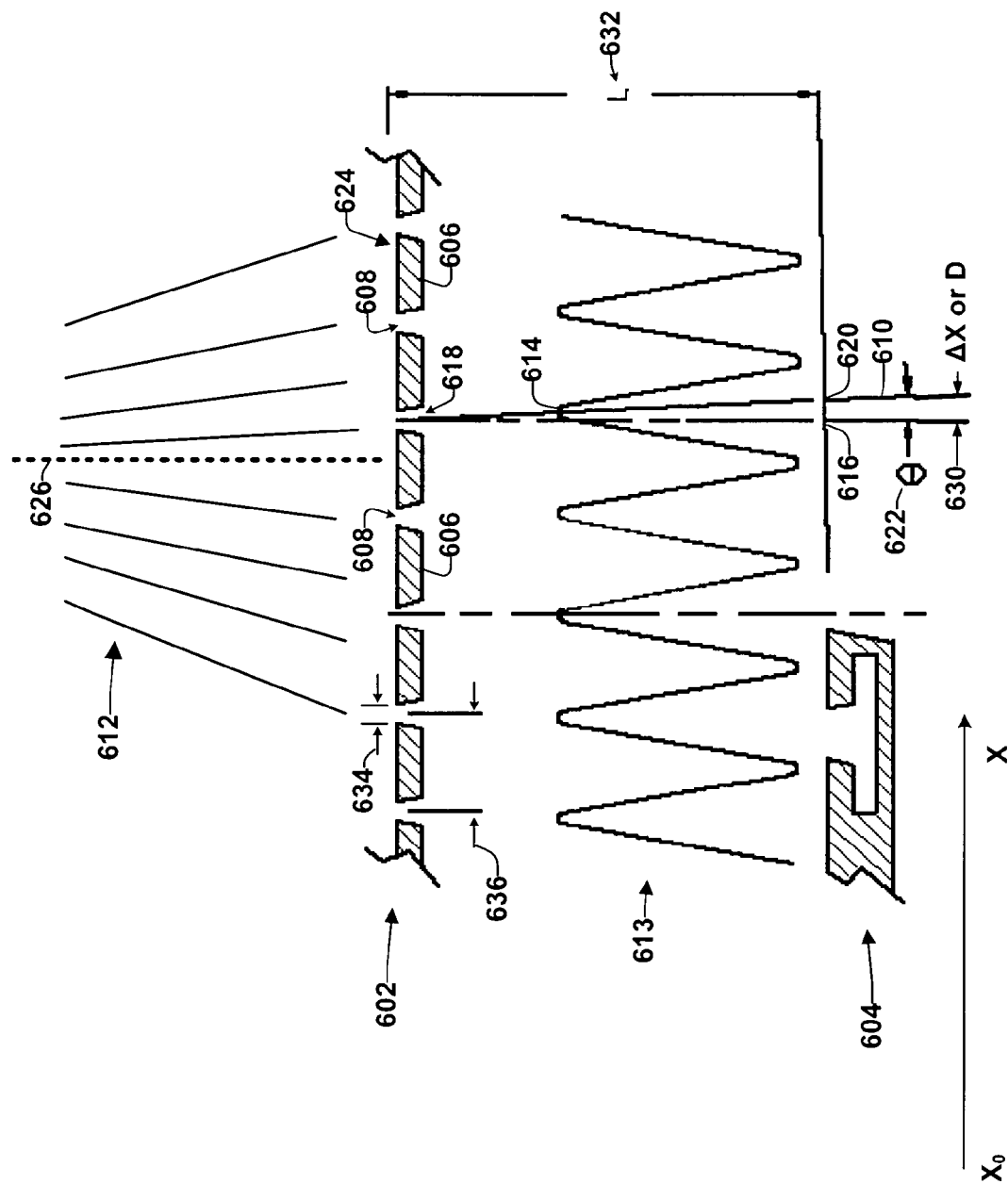
FIG. 6 is a cut away view illustrating an exemplary mask and profiler that may be used in accordance with one or more aspects of the present invention.

FIG. 6 illustrates an exemplary mask 602 and profiler 604 that can be used to determine implantation angles according to one or more aspects of the present invention. The mask 602 comprises a plurality of tines 606 separated by respective slots 608 that allow beamlets 610 of ions originating from a diverging ion beam 612 to pass there-through onto the profiler 604, which is located behind (or downstream) of the mask 602. The profiler 604 is sensitive to the ion current such that locations on the profiler whereon ions impinge output a current indicative of the intensity of the impinging radiation. A peak intensity of ions at a location other than an expected location immediately behind a slot means that the radiation is not coming straight through the slot, but is instead coming in at some angle.

For example, an exemplary plot of profiler current 613 indicates that the peak 614 for beamlet or ray of radiation 610 does not correspond to an expected location 616 immediately behind the slot 618 through which this ray 610 passes. Instead, this peak 614 corresponds to a location 620 offset by a small amount $\Delta X$ from the expected location 616 immediately behind the slot 618, where this location 620 is a function of the angle $\Theta$ 622 from which the ray 610 deviates from its expected position.

The angle $\Theta$ 622 can be calculated by determining the arctangent of the distance D 630 between locations 616 and 620 divided by the length L 632 of separation between the mask 602 and the profiler 604 (e.g., arctan(D/L)). In one example, L is about 244 millimeters, while the slots have a width 634 of about 2.5 millimeters and the tines have a width 636 of about 12.5 millimeters. It can be appreciated that positive $\Theta$ angles mean that rays are aiming to the right, while negative $\Theta$ angles indicate that rays are aiming to the left. Similarly, a positive slope to a graph of angles across the workpiece implies diverging rays and negative slope implies converging rays.

It can be appreciated that, as depicted in the illustrated example, the profiler 604 may not span the entirety of the mask 602, but may instead comprise a smaller structure that is scanned or moved behind the mask 602. For example, the profiler 604 may begin at location $X_0$ and move along direction X collecting data (e.g., ion current) at 1024 points over a distance of 304.8 millimeters (e.g., generally corresponding to the diameter/size of a workpiece or wafer). It can be appreciated that the points, or rather the respective positions of the profiler where the data is acquired (e.g., relative to starting position $X_0$ of the moving profiler), correspond to or can be correlated to locations on a profiler that would span the entirety of the mask 602, and can thus similarly be correlated to corresponding locations on a workpiece. This allows respective implantation angles of rays impinging upon particular locations of a workpiece to be determined.

In accordance with one or more aspects of the present invention, the beam 612 is allowed to diverge, such as by reducing the bias applied to a P-lens, for example. Somewhere between the range of angles of +/−4 degrees within the divergent beams, there will be ions that are aligned with the crystal planes of the wafer. The workpiece is then examined, such as with a Therma-Probe metrology tool from Therma-Wave Inc., for example, to determine the location on the workpiece where less damage has occurred to the lattice structure of the workpiece, and thus where ions were implanted substantially parallel to crystal planes of the workpiece, where this location corresponds to a particular implantation angle. The implantation system can be calibrated in light of the particular implantation angle to achieve desired doping (e.g., in light of channeling and shadowing considerations).

Accordingly, a comparison of the location on or position of the profiler that gives rise to the actual peak current to the location on or position of the profiler, which is nominally immediately behind the slot (e.g., where the peak current would be if the radiation was coming straight through the slot) provides an indication of the angle of the radiation. As such, for the implant above with divergent rays, the location on the workpiece where little damage has occurred to the lattice structure may be correlated to a similar location on or position of the profiler, where the location on or position of the profiler has an associated implantation angle. By way of example, if the location on the workpiece is 3 millimeters from the center of the workpiece, then the relevant implantation angle would be the angle associated with the corresponding location on or position of the profiler (e.g., 3 millimeters from the center of travel of the profiler). This, of course, presumes that the relative orientation between the beam and the workpiece (and more particularly between the beam and the lattice structure of the workpiece) and between the beam and the mask and profiler remain the same when the beam is directed at the workpiece and when the beam is directed at the mask and profiler. This is achieved by making the measurements with the mask and profiler on the same beam just prior to the implant of the work piece.

Figure 7:
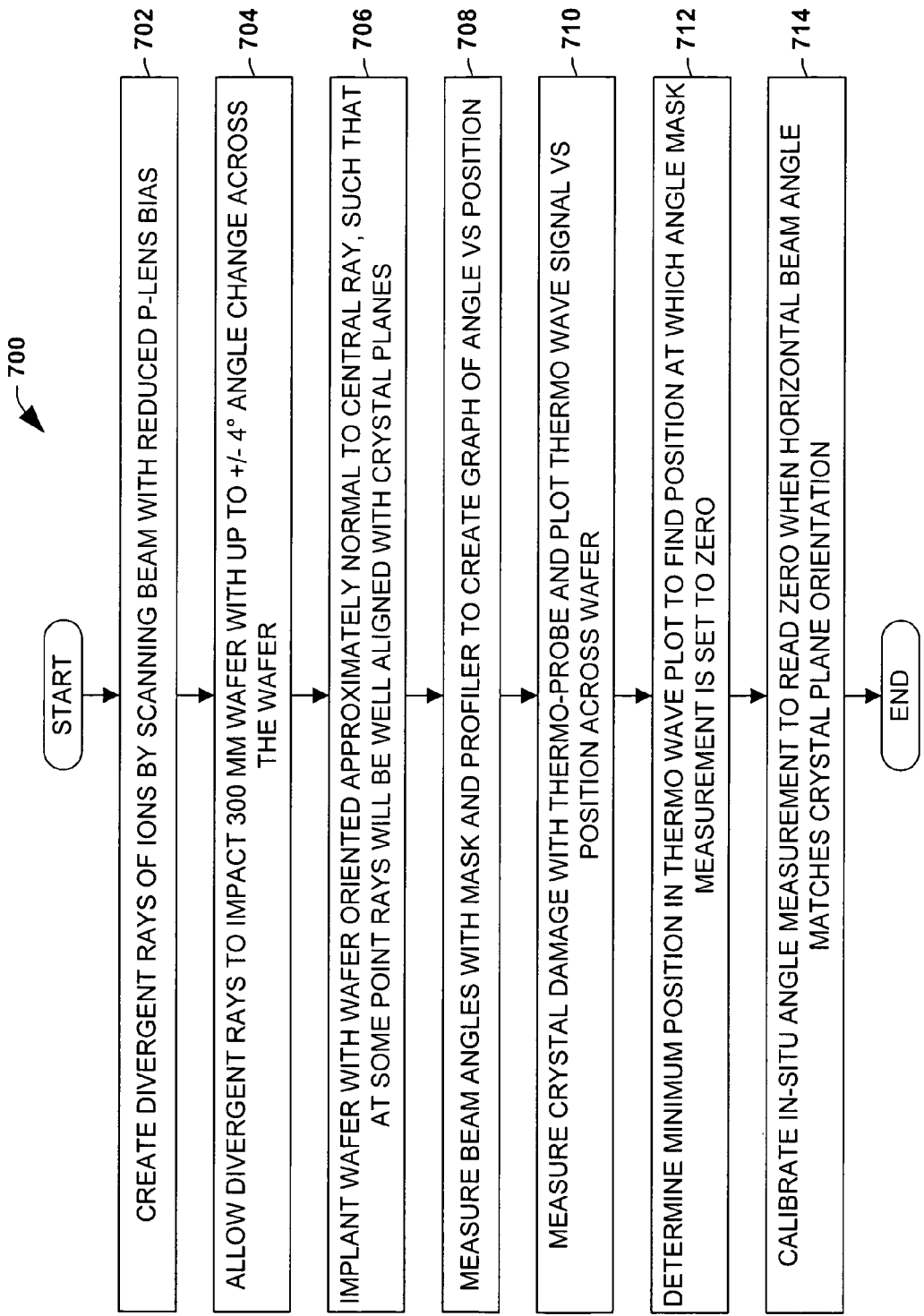
FIG. 7 is an exemplary flow diagram illustrating a method for establishing a relative orientation between an ion beam and lattice structure of a workpiece according to one or more aspects of the present invention.

Referring now to FIG. 7, an exemplary methodology 700 is illustrated for determining a relative orientation of an ion beam to the lattice structure of a workpiece and calibrating an ion implantation system in response thereto according to one or more aspects of the present invention. Although the methodology 700 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated acts may be required to implement a methodology in accordance with the present invention.

The methodology begins at 702 wherein a divergent ion beam is directed toward the workpiece into which ions are to be selectively implanted by the beam. As will be discussed below, the ion beam may be allowed to diverge by altering (e.g., reducing) a bias applied to an electrode that serves to parallelize rays of the ion beam. In one example, the ion beam with a cross sectional diameter of about one inch near the workpiece is fanned out by the scanner to create rays of ions that effectively diverge from the scanner vertex in the horizontal plane. With the reduced P-lens bias, these divergent rays of the beam strike the workpiece at angles ranging from about +4 degrees to about −4 degrees from the normal to the wafer, or the central axis or vertex of the ion beam.

Then, at 704, the wafer is implanted with the range of angles such that at some point on the wafer the angle of the ions will match the angle of the crystal planes. The wafer may be a 300 mm wafer, for example.

At 706, angle measurements are taken of different positions within a single beam. These angles are measured relative to the position of a mask and profiler, such as that described above with regard to FIG. 6, to create a graph of angle vs position. At 708, after the implant, damage to the wafer is measured, such as with a Thermo-probe, for example, and a graph of the resulting Therma Wave (TW) signal as a function of the horizontal position on the wafer is generated. At 710, the position on the wafer map or graph of TW signal vs position corresponding to minimum damage or minimum TW signal is determined. This is the position at which the beam angle is best aligned with the crystal planes.

At 712, the ion implantation system can then be calibrated to give zero angle measurement at the position of the ray that implants ions substantially parallel to crystal planes of the lattice structure of the workpiece. For example, this angle can be designated as the "zero angle" of the system.

It will be appreciated that compensation for crystal cut error can be achieved by implanting two wafers from the same boule, one at zero degree twist and one at 180 degree twist, about the normal to the wafer surface, so that half the difference of the two position minima is the position at which the beam is aligned with a crystal having little to no error.

It will be appreciated that the best (e.g., least expensive, least complex, most efficient) manner to adjust the relative orientation between the beam and wafer may be determined. By way of example only, and not limitation, if a single wafer is mounted on a wafer support for doping, then one or more components within a beamline assembly may be selectively controlled to adjust the angle of implantation. If, on the other hand, multiple wafers are mounted on a batch type wafer support, then one or more components of both the beamline assembly and an end station can, for example, be selectively adjusted to achieve a desired implantation result.

Figure 8:
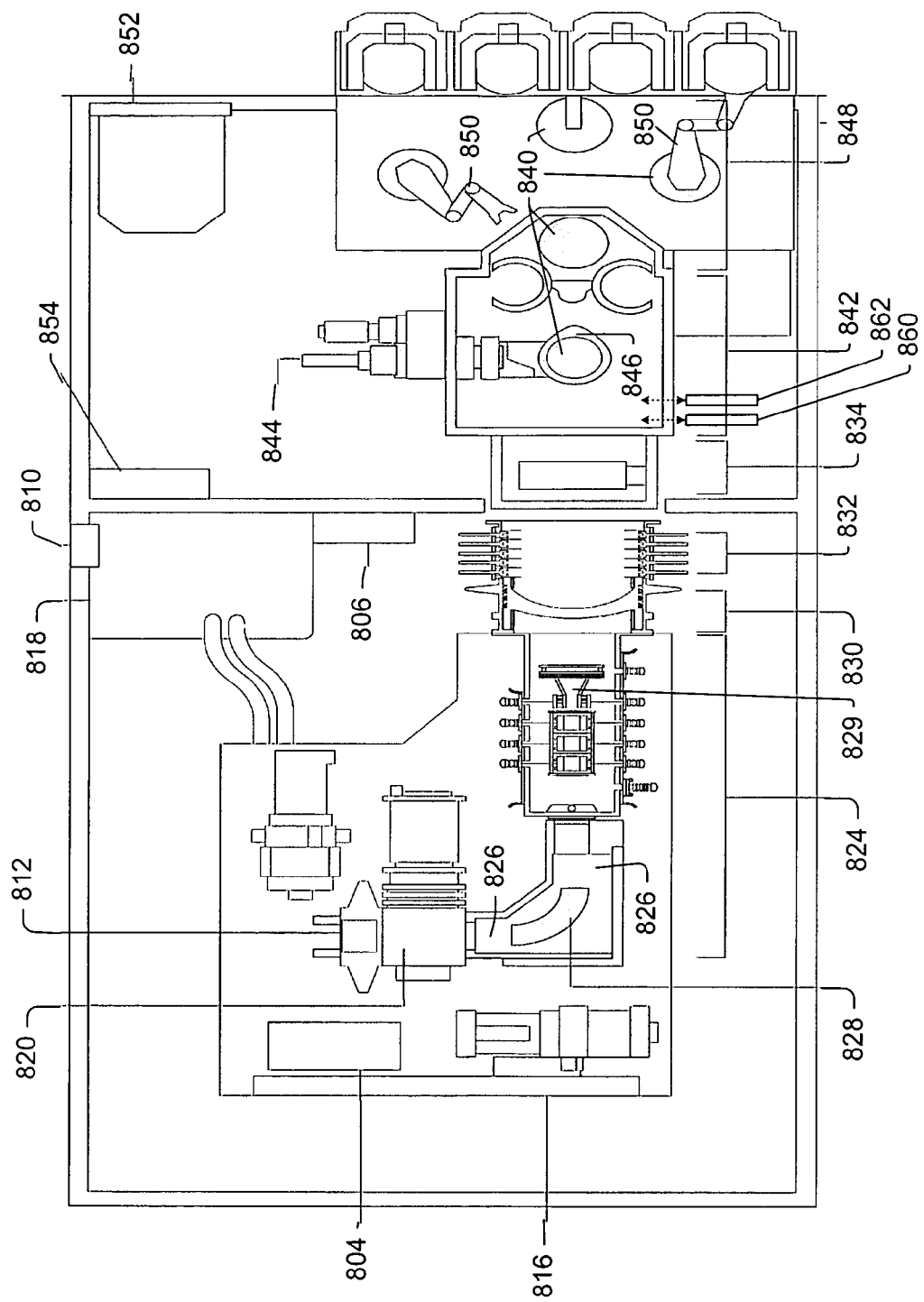
FIG. 8 illustrates another exemplary ion implantation system wherein one or more aspects of the present invention may be implemented.

FIG. 8 illustrates an ion implantation system 800 suitable for implementing one or more aspects of the present invention. The system 800 includes a modular gas box 804, an auxiliary gas box 806 and a gas box remote purge control panel 810. The gas boxes 804, 806 comprise, among other things, one or more gases of a dopant substance, and the boxes 804, 806 facilitate selective delivery of the gas(es) into an extended life ion source 812 within the system 800, wherein the gas(es) can be ionized to generate ions suitable for implantation into wafers or workpieces selectively brought into the system 800. The gas box remote control panel 810 facilitates venting or purging gas(es) or other substances out of the system 800 on an as needed or desired basis.

High voltage terminal power distribution 816 and a high voltage isolation transformer 818 are included to, among other things, electrically excite and impart energy to the dopant gas(es) to generate ions from the gas(es). An ion beam extraction assembly 820 is included to extract ions from the ion source 812 and accelerate them into a beamline assembly 824, which includes a mass analysis magnet 828. The mass analysis magnet 828 is operable to sort out or reject ions of an inappropriate charge-to-mass ratio. In particular, the mass analysis magnet 828 comprises a beamguide 826 having sidewalls into which ions of an undesired mass-to-charge ratio collide as they are propagated through the beamguide 826 by way of one or more magnetic fields generated by magnet(s) of the mass analysis magnet 828.

A scanner 829 that deflects the beam at small angles left and right allows the beam to span a large diameter target. A scan angle correction lens 830 accelerates the beam by a fixed factor and cancels the divergent component of the velocity, so that ions are moving substantially parallel after this lens. An acceleration/deceleration column 832 may be included to assist with controlling and adjusting the speed, and/or focusing, of ions within the ion beam. A component 834 operable to filter out contaminant particles, such as a final energy filter, may also be included within the system 800.

Wafers or workpieces 840 are loaded into an end station chamber 842 for selective implantation with ions. A mechanical scan drive 844 maneuvers the wafers within the chamber 842 to facilitate selective encounters with the beam(s). The scan drive may, for example, maneuver a workpiece holder 846 that holds one or more wafers 840 (e.g., for serial implants) about one or more axes to facilitate an unlimited number of implantation angles. The wafers or workpieces 840 are moved into the end station chamber 842 by a wafer handling system 848, which may include, for example, one or more mechanical or robotic arms 850.

An operator console 852 allows an operator to regulate the implantation process by selectively controlling one or more components of the system 800. Finally, a power distribution box 854 is included to provide power to the overall system 800. U.S. Pat. No. 4,975,586 to Ray discloses an exemplary end station 842 and components thereof in slightly greater detail, where the end station has a wafer support or holder that is maneuverable about multiple axes. The entirety of this patent is thus hereby fully incorporated by reference.

According to one or more aspects of the present invention, a component that assists with controlling the angle of the scanned ion beam, such as the scan angle correction lens 830, for example, is deactivated or turned down, such as by reducing a bias voltage applied thereto so that the ion beam is allowed to diverge and/or fan out before impinging upon the workpiece. In one example, the divergent ion beam is created by scanning a "pencil shaped" beam with a cross sectional diameter of about one inch near the workpiece so that rays of the beam strike the workpiece at angles ranging up to +4 degrees to about −4 degrees from the normal of the mechanical surface of the workpiece. A metrology tool (not shown) is then used to find an area on the workpiece where minimum damage has occurred to the lattice structure and thus where ions have been implanted substantially parallel to planes of the lattice structure. A corresponding location on or position of a profiler is then determined where the location on or position of the profiler has an associated angle that corresponding to the angle of the ray of the divergent ion beam responsible for implanting ions into the workpiece substantially parallel to planes of the lattice structure. Accordingly, a mask 860 and associated profiler 862 can be associated with the system (e.g., inside the endstation 842) so that they can be selectively brought in front of the ion beam to associate respective implantation angles with different locations on or positions of the profiler 862. It will be appreciated that the mask 860 would generally be situated near the entrance of the endstation 842 and the profiler 862 would be situated at the plane of the workpiece or wafer 840.

Figure 9:
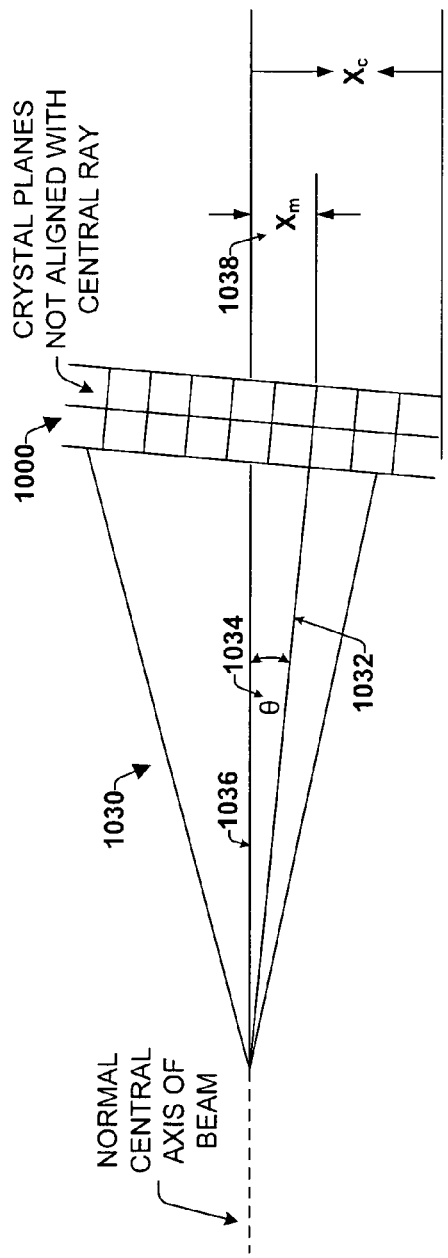
FIG. 9 is a diagram illustrating an example of a divergent ion beam directed at crystal planes of a workpiece according to one or more aspects of the present invention.
Figure 10:
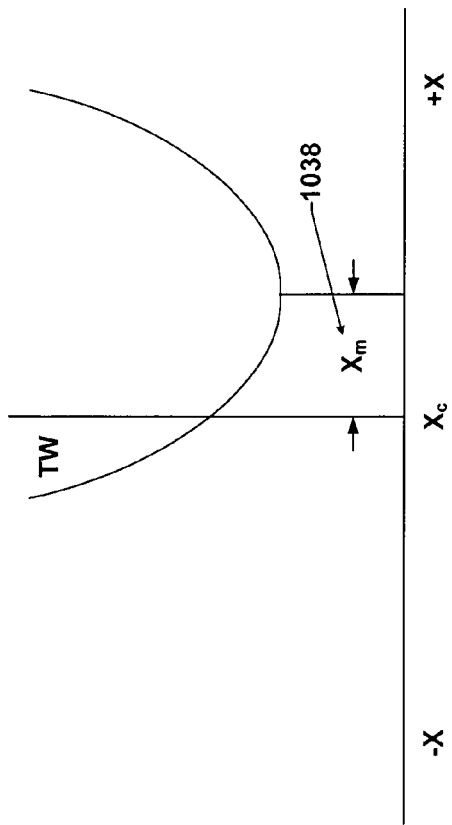
FIG. 10 is a diagram illustrating a plot of Thermo Wave (TW) values indicating degree of damage to lattice structure versus measured location.

Turning to FIGS. 9 and 10, an example of a portion of a workpiece and more particularly lattice structure 1000 of the workpiece is illustrated wherein a divergent ion beam 1030 is directed at the lattice structure 1000 according to one or more aspects of the present invention. Crystal planes of the lattice structure are not aligned with the central axis of the beam or the central ray of the beam. Since the beam is divergent, however, a ray 1032 of the beam 1030 is substantially parallel to planes of the lattice structure 1000, while the remainder of beam 1030 is not. Accordingly, ions within the ray 1032 would cause little damage to the surrounding lattice structure and would thus be implanted deeper into a channel, whereas ions from other rays of the beam would impact and damage the lattice structure within a workpiece.

According to one or more aspects of the present invention, an angle ⊖ 1034 of the ray 1032 from the central axis or vertex 1036 of the divergent beam 1030, is determined by finding the location, Xm 1038 (relative to the workpiece center Xc) on the workpiece where little damage is done to the lattice structure, and then finding a corresponding location on a profiler, where the corresponding location on the profiler reveals the associated angle ⊖ 1034. The location Xm 1038 of minimum damage can be revealed as measured by a Thermo Probe by plotting the TW signal 1040 versus position (FIG. 10). In one example, the divergent ion beam is allowed to fan out so that rays of the beam strike the workpiece at angles from about +4 degrees to about −4 degrees from the central axis of the ion beam, or the normal to the mechanical surface of the workpiece.

FIGS. 11 and 12 illustrate the same divergent beam 1230 used to implant the crystal structure 1000 of FIG. 9 being measured by a moving profiler 1239. The profiler 1239 will measure the range of angles of the beamlets 1243 through the mask 1241 as a nominally straight line 1245 of angle versus position (FIG. 12). If the profiler is not calibrated to the wafer crystal planes, the graph will cross zero degrees at a different location 1247 than that corresponding to the minimum damage on the wafer 1246. One can then calibrate the mask/profiler angles to give zero at the position of the minimum damage.

It can thus be appreciated that implementing one or more aspects of the present invention allows the relative orientation between an ion beam and lattice structure of a workpiece to be known regardless of what the beam angle is relative to an end station, or what the chuck angle (upon which the wafer resides) is, or what the beam angle is relative to the mechanical surface of the wafer. This dramatically simplifies setup and/or reduces required calibration (times). Additionally, uncertainties introduced by taking measurements on a bunch of wafers (e.g., margins of error that are repeatedly introduced, and thus potentially compounded, each time a measurement is taken) are eliminated. Utilizing the data to adjust the angle of incidence of an ion beam, in accordance with one or more aspects of the present invention also facilitates process repeatability.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein merely means an example, rather than the best.

What is claimed is:

1. A method of establishing a relative orientation between an ion beam and lattice structure of a workpiece into which ions are to be selectively implanted by the ion beam, comprising:
   directing a divergent ion beam toward a workpiece into which ions are to be selectively implanted;
   determining an angle of a ray of the ion beam that provides a stream of ions substantially parallel to crystal planes of the workpiece; and
   calibrating an ion implantation system with respect to the angle of the ray.

2. The method of claim 1, further comprising:
   reducing a bias applied to an electrode to allow the ion beam to diverge.

3. The method of claim 2, where the electrode is curved.

4. The method of claim 1, further comprising:
   determining a location on the workpiece where a substantially minimum amount of damage has occurred to the crystal lattice structure of the workpiece to ascertain where ions are implanted substantially parallel to crystal planes of the workpiece.

5. The method of claim 4, wherein a Therma-Probe metrology tool is used to determine the location on the workpiece.

6. The method of claim 4, further comprising:
   correlating the location on the workpiece where a substantially minimum amount of damage has occurred to the lattice structure to the angle of the ray.

7. The method of claim 6, further comprising:
   correlating the location on the workpiece where a small amount of damage has occurred to the lattice structure to a corresponding location on a profiler or position of a profiler, where the profiler facilitates determining the angle of the ray.

8. The method of claim 7, further comprising:
   placing a mask and a profiler in the path of the divergent ion beam such that one or more beamlets pass through slots in the mask and impinge upon the profiler; and
   determining respective implantation angles of beamlets that impinge upon the profiler.

9. The method of claim 8, wherein
   the ray corresponds to a beamlet that impinges upon the location of the profiler or position of the profiler that corresponds to the location on the workpiece where a small amount of damage occurs to the lattice structure of the workpiece, and
   the angle of the ray corresponds to the arctan of a distance (D) between the actual ending location of the beamlet and an expected ending location of the beamlet divided by the length (L) of separation between the mask and the profiler.

10. The method of claim 9, where correlating the location on the workpiece to the profiler comprises:
determining a distance between
a position on the workpiece where a central axis of the ion beam would impact workpiece and
the location on the workpiece where a small amount of damage occurs to the lattice structure, and
correlating the distance to a corresponding measurement on the profiler.

11. The method of claim 1, wherein calibrating the ion implantation system comprises:
setting a zero angle of the system to the determined angle of the ray.

12. The method of claim 1, wherein channeling and shadowing effects are also considered in calibrating the system.

13. A method of establishing a relative orientation between an ion beam and lattice structure of a workpiece into which ions are to be selectively implanted by the ion beam, comprising:
causing an ion beam to diverge by reducing a bias applied to a parallelizing electrode;
directing the divergent ion beam toward a workpiece into which ions are to be selectively implanted;
determining an angle of a ray of the divergent ion beam that provides a stream of ions substantially parallel to crystal planes of the workpiece; and
calibrating an ion implantation system with respect to the angle of the ray.

14. The method of claim 13 further comprising:
determining a location on the workpiece where a small amount of damage has occurred to the crystal lattice structure of the workpiece to ascertain where ions are implanted substantially parallel to crystal planes of the workpiece.

15. The method of claim 14, further comprising:
correlating the location on the workpiece where a small amount of damage has occurred to the lattice structure to a corresponding location on a profiler or position of a profiler, where the profiler facilitates determining the angle of the ray.

16. The method of claim 15, further comprising:
placing a mask and a profiler in the path of the divergent ion beam such that one or more beamlets pass through slots in the mask and impinge upon the profiler; and
determining respective implantation angles of beamlets that impinge upon the profiler.

17. The method of claim 16, wherein
the ray corresponds to a beamlet that impinges upon the location of the profiler or position of the profiler that corresponds to the location on the workpiece where a small amount of damage occurs to the lattice structure of the workpiece, and
the angle of the ray corresponds to the arctan of a distance (D) between the actual ending location of the beamlet and an expected ending location of the beamlet divided by the length (L) of separation between the mask and the profiler.

18. The method of claim 17, where correlating the location on the workpiece to the profiler comprises:
determining a distance between
a position on the workpiece where a central axis of the ion beam would impact workpiece and
the location on the workpiece where a small amount of damage occurs to the lattice structure, and
correlating the distance to a corresponding measurement on the profiler.

19. The method of claim 13, wherein calibrating the ion implantation system comprises:
setting a zero angle of the system to the determined angle of the ray.

20. The method of claim 13, wherein channeling and shadowing effects are also considered in calibrating the system.

21. The method of claim 13, wherein calibrating the ion implantation system comprises:
implanting two wafers oriented at 180 degree rotation from each other, and averaging the position of the minima in damage to compensate for a small crystal cut error in the wafers, thus calibrating the system to an ideal, perfect crystal.

* * * * *